United States Patent [19]

Noufer et al.

[11] Patent Number: 4,471,242

[45] Date of Patent: Sep. 11, 1984

[54] TTL TO CMOS INPUT BUFFER

[75] Inventors: Glenn E. Noufer, Austin; William J. Donoghue, Round Rock, both of Tex.

[73] Assignee: Motorola, Inc., Schaumburg, Ill.

[21] Appl. No.: 332,646

[22] Filed: Dec. 21, 1981

[51] Int. Cl.³ .................... H03K 19/094; H03K 3/356
[52] U.S. Cl. .................................. 307/475; 307/291; 307/297; 307/363; 307/451
[58] Field of Search ............... 307/443, 451, 475, 530, 307/354, 362, 363, 242, 572, 579, 585, 264, 291, 296 R, 297, 279

[56] References Cited

U.S. PATENT DOCUMENTS

| | | | |
|---|---|---|---|
| 3,675,144 | 7/1972 | Zuk | 307/443 X |
| 3,739,194 | 6/1973 | Freeman et al. | 307/296 X |
| 3,937,982 | 2/1976 | Nakajima | 307/481 X |
| 3,975,649 | 8/1976 | Kawagoe et al. | 307/297 X |
| 4,039,862 | 8/1977 | Dingwall et al. | 307/475 |
| 4,045,691 | 8/1977 | Asano | 307/475 X |
| 4,048,518 | 9/1977 | Koo | 307/475 X |
| 4,128,775 | 12/1978 | Frederiksen et al. | 307/475 |
| 4,342,928 | 8/1982 | Gschwendtner et al. | 307/475 |
| 4,380,710 | 4/1983 | Cohen et al. | 307/451 X |

OTHER PUBLICATIONS

Dingwall, "TTL-to-CMOS Buffer Circuit", *RCA Tech. Notes*, TN No. 1114, 6-11-1975, pp. 1-3.

*Primary Examiner*—Stanley D. Miller
*Assistant Examiner*—David R. Hudspeth
*Attorney, Agent, or Firm*—Anthony J. Sarli, Jr.; Jeffrey Van Myers; James L. Clingan, Jr.

[57] ABSTRACT

A TTL to CMOS input buffer accomplishes buffering a TTL signal to a CMOS signal without requiring current flow through a CMOS input inverter in a static condition by introducing a reference voltage to match the lowest level of a logic "1" of the TTL signal. The input inverter has a P channel transistor which, by having a source at the reference voltage, does not turn on when the TTL signal is at the lowest level of a logic "1". The reference voltage is selected to be less than the lowest level of a logic "1" minus the threshold voltage of the P channel transistor.

2 Claims, 3 Drawing Figures

TTL TO CMOS INPUT BUFFER

CROSS-REFERENCE TO A RELATED APPLICATION

Related subject matter is disclosed in the following related application filed simultaneously herewith and assigned to the assignee hereof:

1. U.S. patent application No. 332,645 entitled "Reference Voltage Generator."

TECHNICAL FIELD

The invention relates to input buffers, and more particularly to low power input buffers which can level shift TTL inputs to CMOS.

BACKGROUND ART

In complementary metal oxide semiconductor (CMOS) technology a P channel insulated gate field effect transistor IGFET is in series with an N channel IGFET between a positive and a negative power supply terminal so that one of the two transistors is always off in a static condition to prevent current from flowing between the two power supply terminals in the static condition. Being able to detect a transistor transistor logic (TTL) output while keeping one of the P and N channel IGFETs off over the entire TTL output range is desirable in order to minimize power consumption. To conserve power is a typical reason for using CMOS. Because a TTL output can be as low as 2.0 volts for a logic "1", there is difficulty ensuring the P channel IGFET is off while contemporaneously ensuring the N channel IGFET is on.

There are CMOS circuits which operate at different logic levels which are interfaced in a manner so that one of the N and P channel transistors is off. In such a case one set of logic circuits operates at a lower power supply voltage than that of another set of circuits, with the lower power supply voltage set of circuits providing an output which must be interfaced with the other set of circuits. A pair of inverters are coupled to a pair of cross-coupled amplifiers. The pair of inverters operate at the lower power supply voltage and provide an output which is coupled to the pair of cross-coupled amplifiers which operate at the higher power supply voltage. A key aspect of the operation is that each set of logic circuits provide signals which are rail to rail, i.e., a logic "1" is provided at or very near the positive power supply voltage, and a logic "0" is provided at or very near the negative power supply voltage.

In TTL circuits, however, that is not the case. Because a TTL logic "1" output can be as low as 2.0 volts with a 5 volt power supply, the TTL logic is not directly analogous to the lower power supply set of CMOS circuits.

BRIEF SUMMARY OF THE INVENTION

An object of the present invention is to provide an improved TTL to CMOS input buffer.

Another object of the invention is to provide a TTL to CMOS input buffer using less power.

Yet another object is to provide a TTL to CMOS input buffer which uses a reference voltage generator to provide a voltage to a pair of inverters of a CMOS level-shifter to match a voltage level of a TTL signal received on an input of the buffer.

The above and other objects and advantages of the present invention are achieved by a TTL to CMOS input buffer for providing an output signal in a first logic state when a TTL input signal is between a TTL supply voltage and a TTL reference voltage. The input buffer has a first transistor of a first conductivity type having a characteristic threshold voltage and having a control electrode for receiving the TTL signal, a first current electrode coupled to a reference voltage, and a second current electrode for providing a first output; a first transistor of a second conductivity type having a control electrode coupled to the control electrode of the first transistor of the first conductivity type, a first current electrode coupled to a first power supply terminal, and a second current electrode coupled to the second current electrode of the first transistor of the first conductivity type, and reference voltage generator means coupled to a second power supply terminal and the first power supply terminal for providing a CMOS reference voltage at a voltage which is no closer to the first power supply voltage than the TTL reference voltage minus the threshold voltage of the first transistor of the first conductivity type.

DESCRIPTION OF THE PREFERRED EMBODIMENT

Figure 1:
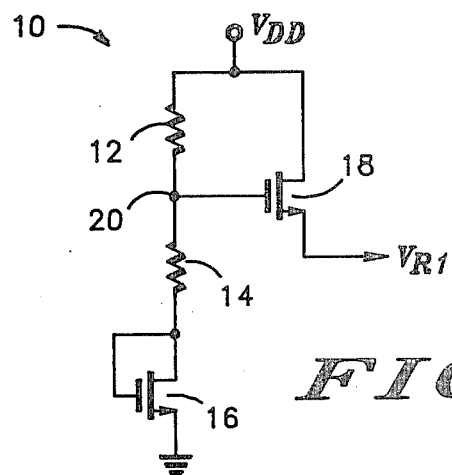
FIG. 1 is a circuit diagram of a reference voltage generator of the prior art.
Figure 2:
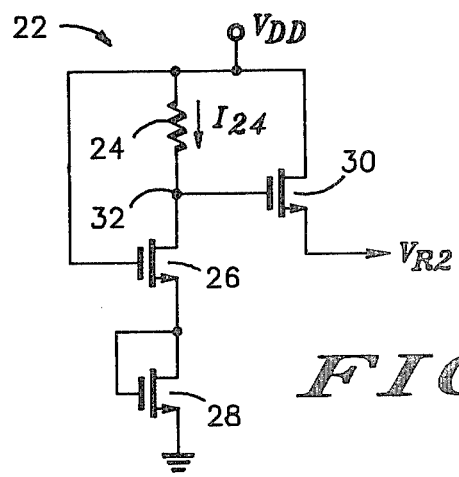
FIG. 2 is a circuit diagram of a reference voltage generator according to a preferred embodiment of the present invention.

Shown in FIG. 1 is a reference voltage generator 10 of the prior art comprised of a resistor 12, a resistor 14, a transistor 16 and a transistor 18. Both the prior art shown in FIG. 1 and a preferred embodiment shown in FIG. 2 are depicted using N channel insulated gate field effect transistors of an enhancement type having a characteristic threshold voltage of 0.4 to 0.8 volts. The circuit of FIG. 3 includes P channel insulated gate field effect transistors of an enhancement type having a characteristic threshold voltage of $-0.4$ to $-0.8$ volts.

Resistor 12 has a first terminal connected to a positive power supply terminal $V_{DD}$, and a second terminal connected to a node 20. Resistor 14 has a first terminal connected to node 20, and a second terminal. N channel transistor 16 has a gate and drain connected to the second terminal of resistor 14, and a source connected to a negative power supply terminal shown as ground. N channel transistor 18 has a control electrode coupled to node 20, a drain connected to $V_{DD}$, and a source providing an output of reference voltage generator 10. The output is a reference voltage $V_{R1}$.

Resistors 12 and 14 provide a standard resistor divider function. Transistor 16 is diode-connected to provide a threshold voltage drop in series with resistors 12 and 14. Transistor 16 has a size ratio (channel width to channel length) which is chosen by conventional means to provide essentially only the threshold voltage drop. Accordingly, a voltage $V_{20}$ at node 20 is expressed as a function of the voltage difference between the positive and negative power supply terminal voltages, in this case $V_{DD}$, a resistance $R_{12}$ of resistor 12, a resistance $R_{14}$ of resistor 14, and threshold voltage $V_{T16}$ of transistor 16 in the following equation:

$$V_{20} = \frac{R_{14}}{R_{12} + R_{14}} (V_{DD} - V_{T16}) + V_{T16} \quad (1)$$

Transistor 18 is connected as a source follower. The size ratio of transistor 18 is selected by conventional means so that reference voltage $V_{R1}$ is a threshold voltage $T_{T18}$ of transistor 18 below voltage $V_{20}$ as expressed in the following equation:

$$V_{R1} = V_{20} - V_{T18} \quad (2)$$

Although transistors 16 and 18 would have the same threshold voltage if the source of transistor 18 was connected to ground, because the source of transistor 18 is at a positive voltage, specifically reference voltage $V_{R1}$, threshold voltage $V_{T18}$ is increased beyond threshold voltage $V_{16}$ by a body effect voltage $V_{B1}$ and can be expressed in the following equation:

$$V_{T18} = V_{T16} + V_{B1} \quad (3)$$

Substituting this expression for threshold voltage $V_{T18}$ into equation (2) results in the following equation:

$$V_{R1} = V_{20} - V_{T16} - V_{B1} \quad (4)$$

And now substituting the expression for voltage $V_{20}$ of equation (1) into equation (4):

$$V_{R1} = \frac{R_{14}}{R_{12} + R_{14}} (V_{DD} - V_{T16}) + V_{T16} - V_{T16} - V_{B1} \quad (5)$$

Simplifying equation 5:

$$V_{R1} = \frac{R_{14} V_{DD}}{R_{12} + R_{14}} - \frac{R_{14} V_{T16}}{R_{12} + R_{14}} - V_{B1} \quad (6)$$

Equation (6) shows that reference voltage $V_{R1}$ can be selected by choosing resistance $R_{12}$ and $R_{14}$ for a given $V_{DD}$ and body effect voltage $V_{B1}$. Body effect voltage $V_{B1}$ is of a relatively small, repeatable magnitude which is a function of reference voltage $V_{R1}$. Diode-connected transistor 16 helps compensate for process variations in threshold voltage $V_{T18}$. Additional diode-connected transistors can be placed in series with resistors 12 and 14 as desired for the same purpose. A reference voltage output could be provided at node 20, however, transistor 18 is used to provide the output of voltage reference generator 10 in order to reduce output impedance. Large values for resistances $R_{12}$ and $R_{14}$ are chosen to minimize power consumption.

The reference voltage generator 10 provides, by a simple, power circuit, a relatively accurate, low output impedance reference voltage $V_{R1}$ so long as $V_{DD}$ is held constant. As shown in equation (6), the reference voltage $V_{R1}$, however, is proportional to $V_{DD}$.

Shown in FIG. 2 is a reference voltage generator 22 which retains advantages of reference voltage generator 10 but improves compensation for variations in power supply voltage. Reference voltage generator 22 comprises a resistor 24, an N channel transistor 26, an N channel transistor 28 and an N channel transistor 30. Resistor 24 has a first terminal connected to a positive power supply terminal $V_{DD}$, and a second terminal connected to a node 32. Transistor 26 has a drain connected to the second terminal of resistor 24, a gate connected to $V_{DD}$, and a source. Transistor 28 has a gate and drain connected to the source of transistor 26, and a source connected to a negative power supply terminal shown as ground. Transistor 30 has a drain connected to $V_{DD}$, a gate connected to node 32, and a source providing an output of reference voltage generator 10. The output is a reference voltage $V_{R2}$.

In effect, reference voltage generator 22 differs from reference voltage generator 10 of FIG. 1 by the replacement of resistor $R_{14}$ with transistor 26 in series with resistor 24 and transistor 28 and between node 32 and ground for the purpose of providing improved compensation for changes in $V_{DD}$. Transistor 26 will provide less resistance as $V_{DD}$ decreases. Transistor 26 provides resistance which is inversely proportional to $V_{DD}$. Accordingly, a resistance $R_{32}$ between node 32 and ground decreases as $V_{DD}$ increases and increases as $V_{DD}$ decreases. An increase in $V_{DD}$ will tend to increase a voltage $V_{32}$ at node 32, whereas a decrease in resistance $R_{32}$ will tend to decrease voltage $V_{32}$. Consequently because transistor 26 causes resistance $R_{32}$ to decrease when $V_{DD}$ increases, transistor 26 provides some compensation for increases in $V_{DD}$. A decrease in $V_{DD}$ will tend to decrease voltage $V_{32}$, whereas an increase in resistance $R_{32}$ will tend to increase voltage $V_{32}$. Consequently because transistor 26 causes resistance $R_{32}$ to increase when $V_{DD}$ decreases, transistor 26 provides some compensation for decreases in $V_{DD}$. Therefore, some compensation is provided for both increases and decreases in $V_{DD}$.

Equations (1) through (6) are applicable to reference voltage generator 12 as well as reference voltage generator 10 with voltage $V_{R2}$ analogous to voltage $V_{R1}$, a resistance $R_{24}$ of resistor 24 analogous to resistance $R_{12}$, a threshold voltage $V_{T28}$ of transistor 28 analogous to threshold voltage $V_{T16}$, a body effect voltage $V_{B2}$ of transistor 30 analogous to body effect voltage $V_{B1}$, a resistance $R_{26}$ associated with transistor 26 analogous to resistance $R_{14}$, a voltage $V_{32}$ at node 32 analogous to voltage $V_{20}$, and a threshold voltage $V_{T30}$ of transistor 30 analogous to threshold voltage $V_{T18}$. Substituting analogous elements of reference voltage generator 22 into equation 6 results in the following equation:

$$V_{R2} = \frac{R_{26} V_{DD}}{R_{24} + R_{26}} - \frac{R_{26} V_{T28}}{R_{24} + R_{26}} - V_{B2} \quad (7)$$

Body effect voltage $V_{B2}$ and threshold voltage $V_{T28}$ are essentially fixed constants. Resistance $R_{24}$ is a chosen constant. Resistance $R_{26}$ is a function of chosen features of transistor 26 and is inversely proportional to $V_{DD}$. $V_{DD}$ is a variable for which compensation is desired. The choices of resistance $R_{26}$ and features of transistor 26 are made, however, by assuming $V_{DD}$ is a constant at its nominal voltage, for example 5 volts.

A general equation for current through transistor 26 is as follows:

$$I_D = K \frac{W}{L} [2(V_{GS} - V_T)V_{DS} - V_{DS}^2] \quad (8)$$

$I_D$ is the current through transistor 26, K is a device constant, for example $2.6 \times 10^{-5}$, W is the channel width of transistor 26, L is the channel length of transistor 26, $V_{GS}$ is the gate to source voltage on transistor 26, $V_T$ is the threshold voltage of transistor 26, and $V_{DS}$ is the drain to source voltage on transistor 26. The current through transistor 26 is known for the assumed voltage of $V_{DD}$. A current $I_{24}$ is a design choice, for example 10 microamps, which determines resistance $R_{24}$ in conjunction with a design choice of reference voltage $V_{R2}$. Current $I_{24}$ is expressed as:

$$I_{24} = \frac{V_{DD} - V_{32}}{R_{24}} \quad (9)$$

Voltage $V_{32}$ is a function of reference voltage $V_{R2}$ as follows:

$$V_{32} = V_{R2} - V_{T30} - V_{B2} \quad (10)$$

Therefore current $I_{24}$ is a function of reference voltage $V_{R2}$ as follows:

$$I_{24} = \frac{V_{DD} - V_{R2} + V_{T30} + V_{B2}}{R_{24}} \quad (11)$$

From this equation, resistance $R_{24}$ can be easily selected for the desired current $I_{24}$, assumed voltage of $V_{DD}$, and chosen reference voltage $V_{R2}$ with threshold voltage $V_{T30}$ and body effect voltage $V_{B2}$ being constant. Threshold voltage $V_{T30}$ does vary over process slightly, but transistor 28 provides substantial compensation for this variation.

In order to solve for the size ratio W/L of transistor 26 to obtain the desired reference voltage $V_{R2}$, equation (8) is used to express size ratio W/L in terms of reference voltage $V_{R2}$ and other circuit parameters. Gate to source voltage $V_{GS}$ is expressed as follows:

$$V_{GS} = V_{DD} - V_{T28} \quad (12)$$

Drain to source voltage $V_{DS}$ is expressed as follows:

$$V_{DS} = V_{32} - V_{T28} \quad (13)$$

Substituting the expression for voltage $V_{32}$ of equation (10) results in the following equation:

$$V_{DS} = V_{R2} - V_{T30} - V_{B2} - V_{T28} \quad (14)$$

Now substituting into equation (8) relative to transistor 26 results in the following equation:

$$I_{24} = \quad (15)$$
$$K \frac{W}{L} [2(V_{DD} - V_{T28} - V_{T26})(V_{R2} - V_{T30} - V_{B2} - V_{T28}) - (V_{R2} - V_{T30} - V_{B2} - V_{T28})^2]$$

Solving for size ratio W/L results in the following equation:

$$\frac{W}{L} = \frac{I_{24}}{K[2(V_{DD} - V_{T28} - V_{T26})(V_{R2} - V_{T30} - V_{B2} - V_{T28}) - (V_{R2} - V_{T30} - V_{B2} - V_{T28})^2]} \quad (16)$$

Accordingly, the size ratio W/L can be solved by substituting for the chosen value of current $I_{24}$, constant K, assumed value $V_{DD}$, threshold voltage $V_{T28}$, threshold voltage $V_{T26}$, chosen reference voltage $V_{R2}$, threshold voltage $V_{T30}$, and body effect voltage $V_{B2}$. This size ratio will then cause reference voltage generator 22 to provide the chosen reference voltage $V_{R2}$ at the assumed value of $V_{DD}$. Transistor 26 then provides improved compensation with variations in $V_{DD}$. It should be noted that if transistor 26 has a very small size ratio, it may have a slightly higher threshold voltage, for example 0.2 volts higher, than that of transistors 28 and 30.

Figure 3:
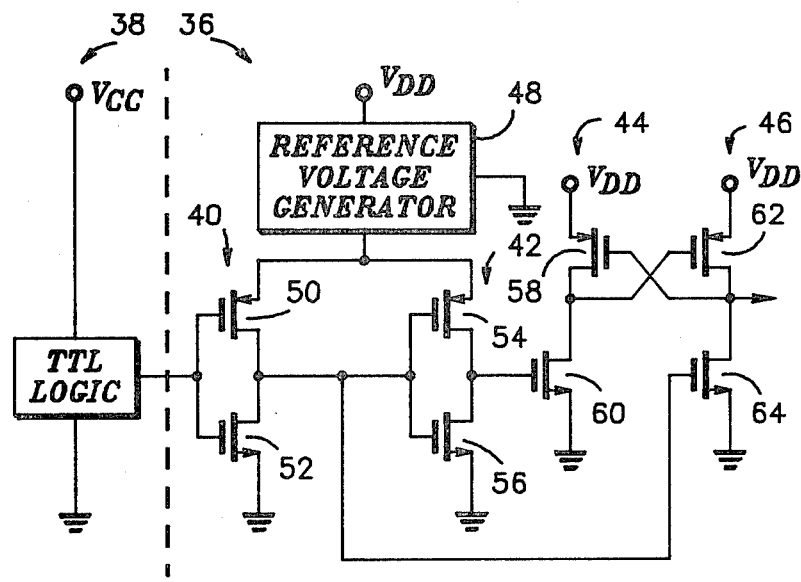
FIG. 3 is a circuit diagram of a TTL to CMOS input buffer according to a preferred embodiment of the present invention.

Shown in FIG. 3 in a TTL to CMOS input buffer 36 for providing an output in response to receiving a TTL signal from a TTL logic circuit 38 which is coupled between a TTL positive power supply voltage, shown as $V_{CC}$, and ground. Input buffer 36 comprises generally an inverter 40, an inverter 42, an amplifier 44, an amplifier 46 and a reference voltage generator 48.

Reference voltage generator 48 is connected to a positive power supply terminal $V_{DD}$, the voltage at which can be, for example, 5 volts, and to a negative power supply terminal, shown as ground. Reference voltage generator 48 provides a reference voltage $V_{48}$ at an output.

Inverter 40 comprises a P channel transistor 50 and an N channel transistor 52. Transistor 50 has a gate as an input of inverter 40 for receiving the TTL signal from TTL logic circuit 38, a drain for providing an output of inverter 40, and a source connected to the output of reference voltage generator 48. Transistor 52 has a gate connected to the gate of transistor 50, a drain connected to the drain of transistor 50, and a source connected to ground.

Inverter 42 comprises a P channel transistor 54 and an N channel transistor 56. Transistor 54 has a gate as an input of inverter 42 connected to the drain of transistor 50, a drain for providing an output of inverter 42, and a source connected to the output of reference voltage generator 48. Transistor 56 has a gate connected to the gate of transistor 54, a drain connected to the drain of transistor 54, and a source connected to ground.

Amplifier 44 comprises a P channel transistor 58 and an N channel transistor 60. Transistor 60 has a gate coupled to the drain of transistor 54, a source coupled to ground, and a drain for providing an output of amplifier 44. Transistor 58 has a source connected to $V_{DD}$, a drain connected to the drain of transistor 60, and a gate for receiving an output of amplifier 46.

Amplifier 46 comprises a P channel transistor 62 and an N channel transistor 64. Transistor 62 has a gate connected to the drain of transistor 60, a drain for providing the output of amplifier 46 and the output of input buffer 36 connected to the gate of transistor 58, and a source connected to $V_{DD}$. Transistor 64 has a gate connected to the drain of transistor 50, a drain connected to the drain of transistor 62, and a source connected to ground.

Inverters 40 and 42 and cross-coupled amplifiers 44 and 46 are connected as a conventional CMOS level-shifter. A logic "1" on the input of inverter 40 causes transistor 52 to turn on so that the output of inverter 40 is at essentially ground which turns off transistors 56 and 64 and turns on transistor 54. Transistor 54 then couples the voltage on its source to the gate of transistor 60, turning transistor 60 sufficiently on so that its drain is at essentially ground, which in turn causes transistor 62 to turn on. A logic "1" is consequently supplied by the output of input buffer 36 at essentially $V_{DD}$. Conversely when a logic "0" is received on the input of inverter 40, transistor 50 turns on to provide a voltage on the output of inverter 40 which is essentially the voltage on the source of transistor 50. The output of inverter 40 then turns on transistor 64 so that the drain of transistor 64, which is also the output of input buffer 36, is at essentially ground. In addition, with transistor 50 on, transistor 56 will turn on causing the output of inverter 42 to be at essentially ground which will turn transistor 60 off. With the drain of transistor 64 at essentially ground transistor 58 will be on to provide essentially $V_{DD}$ to the drain of transistor 60 and the gate of transistor 62, so that transistor 62 is off.

This operation of a CMOS level-shifter ensures that one of the transistors in each of inverter 42, amplifier 44 and amplifier 46 will be off in a static condition. Consequently these three circuits do not provide a current path in a static condition. In conventional operation, inverter 40, as well as inverter 42, would have the same power supply connections as that of a CMOS circuit which generates a CMOS signal needing level shifting. A logic "1" would be at essentially the positive power supply voltage and a logic "0" would be at the negative power supply voltage so that one of transistors 50 and 52 would always be off in a static condition. In conventional operation, inverters 40 and 42 operate as output buffers providing true and complementary outputs to cross-coupled amplifiers 44 and 46, a level-shift interface actually being defined between the inverters and the cross-coupled amplifiers.

Operation of input buffer 36, however, defines an interface between TTL logic circuit 38 and inverter 40. The TTL signal generated by TTL logic circuit 38 could be anywhere between 2.0 volts and $V_{CC}$, nominally 5 volts, and still be a logic "1". If the source of transistor 50 was coupled to $V_{CC}$ when a logic "1" of 2.0 volts was received, both transistors 50 and 52 would be on, providing a power wasting current path. Consequently, reference voltage $V_{48}$ of reference voltage generator 48 is coupled to the source of transistor 50 and 52. Reference voltage $V_{48}$ is chosen so that transistor 50 will be off even when the TTL signal is at the lowest voltage level for a logic "1", in this case 2.0 volts. In order to ensure that transistor 50 will be off, reference voltage $V_{48}$ must be less than the lowest voltage level for a logic "1" minus the highest threshold voltage $V_{T50}$ of transistor 50, in this case, 2.0 volts minus $-4.0$ volts which equals 2.4 volts. Consequently reference voltage $V_{48}$ should be less than 2.4 volts.

Reference voltage generator 22 of FIG. 2 could be used as reference voltage generator 48 to provide reference voltage 48 at less than 2.4 volts with reference voltage $V_{R2}$. Other, conventional reference voltage generators could also be used. The power saved by preventing inverter 40 from having a current path between positive and negative power supply terminals, however, may not be sufficient to offset the current used by other reference voltage generators.

The utility for reference voltage generator 48 is apparent in the case, as is the case with TTL, where there is a substantial difference between the positive power supply voltage $V_{CC}$ and the lowest voltage level for a logic "1", 2.0 volts. If the lowest voltage level for a logic "1" is within a threshold voltage $V_{T50}$ of $V_{CC}$, then transistor 50 could be ensured of being off when the TTL signal is logic "1" by simply having the source of transistor 50 connected to $V_{CC}$, or even $V_{DD}$ if $V_{DD}$ is at essentially the same voltage as $V_{CC}$. Consequently reference voltage generator 48 is needed when the lowest voltage level for a logic "1" minus threshold voltage $V_{T50}$ is less than $V_{CC}$. Reference voltage $V_{48}$ is then chosen to be no closer to $V_{CC}$ than the lowest voltage level for a logic "1" minus threshold voltage $V_{50}$.

In choosing reference voltage $V_{48}$ consideration must also be given to the TTL signal in a logic "0" condition, which for TTL is ground to 0.8 volts. Transistor 50 must be on when the TTL signal is at 0.8 volts. Accordingly, the voltage at the source of transistor 50, $V_{48}$, must be greater than 0.8 volts minus the smallest threshold voltage $V_{T50}$, i.e., 0.8 minus $-0.8$ which equals 1.6 volts. Consequently reference voltage $V_{48}$ should be between 1.6 and 2.4 volts. For reasons concerning speed, the voltage should be made closest to the higher of the two voltages.

While the invention has been described in a preferred embodiment, it will be apparent to those skilled in the art that the disclosed invention may be modified in numerous ways and may assume many embodiments other than that specifically set out and described above. Accordingly, it is intended by the appended claims to cover all modificatons of the invention which fall within the true spirit and scope of the invention.

We claim:

1. A TTL to CMOS input buffer for providing complementary output signals representative of a first logic state when a TTL input signal is between a TTL supply voltage and a TTL reference voltage, comprising:

a first transistor of a first conductivity type having a characteristic threshold voltage and having a control electrode for receiving the TTL signal, a first current electrode for receiving a CMOS reference voltage, and a second current electrode for providing a first output signal;

a first transistor of a second conductivity type having a control electrode coupled to the control electrode of the first transistor of the first conductivity type, a first current electrode coupled to a first power supply terminal, and a second current electrode coupled to the second current electrode of the first transistor of the first conductivity type;

reference voltage generator means coupled to a second power supply terminal and the first power supply terminal for providing the CMOS reference voltage at a voltage which is no closer to the first power supply voltage than the TTL reference voltage minus the threshold voltage of the first transistor of the first conductivity type;

a second transistor of the first conductivity type having a control electrode coupled to the second current electrode of the first transistor of the first conductivity type, a first current electrode coupled to the CMOS reference voltage, and a second current electrode for providing a second output signal which is complementary to the first output signal; and a second transistor of the second conductivity type having a control electrode coupled to the control electrode of the second transistor of the first conductivity type, a first current electrode coupled to the first power supply voltage, and a second current electrode coupled to the second current electrode of the second transistor of the first conductivity type.

2. A TTL to CMOS input buffer for providing an output signal in a first logic state when a TTL input signal is between a TTL supply voltage and a TTL reference voltage, comprising:

a first transistor of a first conductivity type having a characteristic threshold voltage and having a control electrode for receiving the TTL signal, a first current electrode for receiving a CMOS reference voltage, and a second current electrode for providing a first output;

a first transistor of a second conductivity type having a control electrode coupled to the control electrode of the first transistor of the first conductivity type, a first current electrode coupled to a first power supply terminal, and a second current electrode coupled to the second current electrode of the first transistor of the first conductivity type;

reference voltage generator means coupled to a second power supply terminal and the first power supply terminal for providing the CMOS reference voltage at a voltage which is no closer to the first power supply voltage than the TTL reference voltage minus the threshold voltage of the first transistor of the first conductivity type;

a second transistor of the first conductivity type having a control electrode coupled to the second current electrode of the first transistor of the first conductivity type, a first current electrode coupled to the CMOS reference voltage, and a second current electrode;

a second transistor of the second conductivity type having a control electrode coupled to the control electrode of the second transistor of the first conductivity type, a first current electrode coupled to the first power supply voltage, and a second current electrode coupled to the second current electrode of the second transistor of the first conductivity type;

a third transistor of the second conductivity type having a control electrode coupled to the second current electrode of the second transistor of the first conductivity type, a first current electrode coupled to the first power supply terminal, and a second current electrode;

a third transistor of the first conductivity type having a first current electrode coupled to the second power supply terminal, a second current electrode coupled to the second current electrode of the third transistor of the second conductivity type, and a control electrode;

a fourth transistor of the second conductivity type having a control electrode coupled to the second current electrode of the first transistor of the first conductivity type, a first current electrode coupled to the first power supply terminal, and a second current electrode for providing a second output coupled to the control electrode of the third transistor of the first conductivity type; and a fourth transistor of the first conductivity type having a control electrode coupled to the second current electrode of the third transistor of the second conductivity type, a first current electrode coupled to the second power supply terminal, and a second current electrode coupled to the second current electrode of the fourth transistor of the second conductivity type.

* * * * *